(12) United States Patent
Zimmerman et al.

(10) Patent No.: US 7,679,185 B2
(45) Date of Patent: Mar. 16, 2010

(54) MICROCIRCUIT PACKAGE HAVING DUCTILE LAYER

(75) Inventors: Michael A. Zimmerman, North Andover, MA (US); Jonathan Harris, Scottsdale, AZ (US)

(73) Assignee: Interplex QLP, Inc., College Point, NY (US)

( * ) Notice: Subject to any disclaimer, the term of this patent is extended or adjusted under 35 U.S.C. 154(b) by 112 days.

(21) Appl. No.: 11/983,813

(22) Filed: Nov. 9, 2007

(65) Prior Publication Data
US 2008/0128908 A1 Jun. 5, 2008

Related U.S. Application Data

(60) Provisional application No. 60/858,020, filed on Nov. 9, 2006.

(51) Int. Cl.
H01L 23/12 (2006.01)
H01L 23/48 (2006.01)
H01L 23/52 (2006.01)
H01L 29/40 (2006.01)

(52) U.S. Cl. ......... 257/732; 257/751; 257/762; 257/766; 257/772; 257/779

(58) Field of Classification Search ......... 257/772, 257/779, E23.023, E23.026, 732, 751, 762, 257/766, E23.101
See application file for complete search history.

(56) References Cited

U.S. PATENT DOCUMENTS

| | | | |
|---|---|---|---|
| 3,159,462 A * | 12/1964 | Kadelburg | 428/620 |
| 3,279,039 A | 10/1966 | Nippert | |
| 3,293,509 A * | 12/1966 | Emeis | 257/739 |
| 3,581,163 A * | 5/1971 | Eriksson | 257/688 |
| 3,657,611 A | 4/1972 | Yoneda | |
| 4,288,081 A | 9/1981 | Sado | |
| 4,634,638 A * | 1/1987 | Ainslie et al. | 428/671 |
| 4,811,166 A | 3/1989 | Alvarez et al. | |
| 4,880,591 A | 11/1989 | Baba | |
| 5,586,214 A | 12/1996 | Eckman | |
| 5,691,689 A | 11/1997 | Smith et al. | |
| 5,990,560 A * | 11/1999 | Coult et al. | 257/772 |
| 6,206,269 B1 | 3/2001 | Olofsson | |
| 6,506,630 B2 | 1/2003 | Mastboom et al. | |
| 6,596,621 B1 * | 7/2003 | Copeland et al. | 438/614 |
| 6,597,575 B1 * | 7/2003 | Matayabas et al. | 361/705 |
| 6,634,576 B2 | 10/2003 | Verhoff et al. | |
| 6,870,243 B2 | 3/2005 | Elliott et al. | |
| 7,023,089 B1 * | 4/2006 | Lu | 257/751 |
| 7,092,890 B2 | 8/2006 | Elliott et al. | |
| 7,391,116 B2 * | 6/2008 | Chen et al. | 257/762 |
| 7,429,502 B2 * | 9/2008 | Archer et al. | 438/122 |
| 7,459,794 B2 * | 12/2008 | Yokoyama et al. | 257/779 |
| 2004/0112478 A1 | 6/2004 | Bieler et al. | |

(Continued)

*Primary Examiner*—Leonardo Andújar
*Assistant Examiner*—Teresa M Arroyo
(74) *Attorney, Agent, or Firm*—Weingarten, Schurgin, Gagnebin & Lebovici LLP

(57) ABSTRACT

A microcircuit package having a ductile layer between a copper flange and die attach. The ductile layer absorbs the stress between the flange and semiconductor device mounted on the flange, and can substantially reduce the stress applied to the semiconductor device. In addition, the package provides the combination of copper flange and polymeric dielectric with a TCE close to copper, which results in a low stress structure of improved reliability and conductivity.

21 Claims, 2 Drawing Sheets

U.S. PATENT DOCUMENTS

| | | |
|---|---|---|
| 2005/0016584 A1 | 1/2005 | Kukulka et al. |
| 2005/0016750 A1 | 1/2005 | Zimmerman |
| 2005/0183589 A1* | 8/2005 | Salmon .................. 101/3.1 |
| 2005/0194690 A1* | 9/2005 | Ishii et al. ............... 257/772 |
| 2006/0067853 A1* | 3/2006 | Takahashi et al. ......... 420/557 |
| 2006/0175689 A1 | 8/2006 | Shim et al. |
| 2006/0175691 A1 | 8/2006 | Dangelmaier et al. |
| 2006/0200965 A1 | 9/2006 | Farooq et al. |
| 2007/0176293 A1* | 8/2007 | Kayukawa et al. ......... 257/772 |
| 2008/0191358 A1* | 8/2008 | Lu ........................ 257/772 |

* cited by examiner

MICROCIRCUIT PACKAGE HAVING DUCTILE LAYER

CROSS REFERENCE TO RELATED APPLICATIONS

This application claims the benefit under 35 U.S.C. §119(e) of U.S. Provisional Patent Application No. 60/858,020, filed on Nov. 9, 2006, the disclosure of which is incorporated by reference herein.

STATEMENT REGARDING FEDERALLY SPONSORED RESEARCH OR DEVELOPMENT

N/A

BACKGROUND OF THE INVENTION

Microcircuit packages are known for containing a semiconductor device or circuit but are relatively costly to achieve acceptable levels of reliability and performance. The manufacturing goal is to produce a microcircuit package having a high performance at a low cost. However, microcircuit packages of presently known construction cannot achieve intended performance levels at a low cost. In general, known microcircuit packages employ a ceramic material to provide high thermal performance and high reliability.

To achieve low cost, high thermal performance and high reliability for a microcircuit package which will contain a semiconductor device or circuit, the following criteria should be met:
1. High thermal conductivity in a low cost base material;
2. Low cost insulator material with a thermal coefficient of expansion (TCE) match to the base material; and
3. High thermal performance die attach.

Many high performance microcircuit packages are fabricated using ceramic dielectric materials with thermal dissipation structures using "flanges" of materials which have matched TCEs. Typical materials incorporated into ceramic packages as flanges include copper-tungsten, copper/molybdenum clad structures, and aluminum-silicon carbide (Al-SiC). These materials have an advantage of TCEs fairly close to that of the semiconductor devices. Semiconductor devices typically have thermal coefficients of expansion in the range of 2.8-4.0 ppm/° C. The aforementioned flange materials have TCE values in the range of 6.0-10.0 ppm/° C. TCE values below 10.0 ppm/° C. are desirable so that expansion and contraction during temperature extremes do not cause high levels of stress to the semiconductor device which can cause the device to crack. The deficiencies in these materials are that the thermal conductivities are fairly low, i.e., in the range of 150-240 W/mK (Watt per meter Kelvin), and the cost of these materials is high.

A better flange material would be copper or a copper alloy for at least the following reasons. Copper is a material which is commonly available, has a low cost, and can be fabricated using high volume manufacturing techniques such as stamping. Also, copper and copper alloys have a thermal conductivity in the range of 350-400 W/mK. A technical barrier to using copper for flanges in these applications has been the fact that copper and copper alloys have a high TCE (about 17-20 ppm/° C.). This large difference between the TCEs of copper and that of semiconductor devices has resulted in large stresses applied to the semiconductor devices which can cause a failure during operation. In addition, conventional dielectric materials used for this application are ceramic based. The ceramic material has a TCE in the range of about 6-8 ppm/° C., and the combination of the traditional ceramic dielectric and copper flange result in a large mismatch of TCE and results in excessive warpage or cracking of the dielectric.

To minimize the effects of large stresses being applied to the semiconductor devices in conventional packages having copper flanges, one prior art approach employs an adhesive for the die attach. This allows use of a more ductile die attach but has a substantial drawback in that the adhesive has a very low thermal conductivity which limits the performance of the die attach. Another prior art approach uses high lead solder for the die attach, which allows use of a more ductile solder, but the high lead solder is a problem due to environmental issues. A further prior art approach uses a thick layer of gold, typically 300 micro-inches, applied to the backside of the semiconductor die, which allows for a buffer layer of gold on the die, but the thick layer of gold adds considerable cost to the product. A gold layer has been used on the backside of a gallium arsenide die which is soldered with AuSn eutectic solder to a copper substrate, but this approach has traditionally been limited to small devices <3 mm on a side, and has been limited to devices which have a substantially square shape.

As previously noted, the TCE mismatch between the semiconductor device and the flange material results in failure of the semiconductor device or the die attach by reason of the stress induced by the TCE mismatch. In addition, when a ceramic dielectric material is used with a copper flange, the mismatch in TCE between ceramic and copper can cause large stresses to be developed in the structure, which results in excessive warpage or cracking of the dielectric. When the semiconductor device is soldered to the flange, the temperature of the solder at a liquidus point is 280° C. for gold-tin alloys, or 368° C. for a gold-silicon eutectic composition. For these eutectic compositions, the solder turns into a solidus at the aforementioned temperatures. At this solidus point a top layer of the flange material is frozen, and cooling to room temperature causes a bottom portion of the flange to contract more than the top portion, causing the flange to bend into a concave shape. This concave shape subjects the semiconductor device to a bending stress, and such a tensile stress in the semiconductor device can cause a failure of the device.

BRIEF SUMMARY OF THE INVENTION

The invention provides a reliable microcircuit package having the above-noted preferred criteria by use of a ductile layer between the copper flange and the die attach. The ductile layer absorbs the stress between the flange and semiconductor device, and can substantially reduce the stress applied to the semiconductor device. In addition, this invention provides the combination of copper flange and polymeric dielectric with a TCE close to copper. The polymeric material has a TCE about 17 ppm/° C. which is a closer match with copper. This combination results in a low stress structure that is robust when temperature cycled and which also demonstrates low cost and high thermal performance. In one example, the stress can be reduced by up to 40%. This invention, therefore, provides a microcircuit package having improved reliability and a significant improvement in thermal conductivity. In one example, the thermal conductivity can be improved by a factor of about 2.

BRIEF DESCRIPTION OF THE SEVERAL VIEWS OF THE DRAWINGS

The invention will be more fully described in the following detailed description taken in conjunction with the accompanying drawings in which.

DETAILED DESCRIPTION OF THE INVENTION

Figure 1:
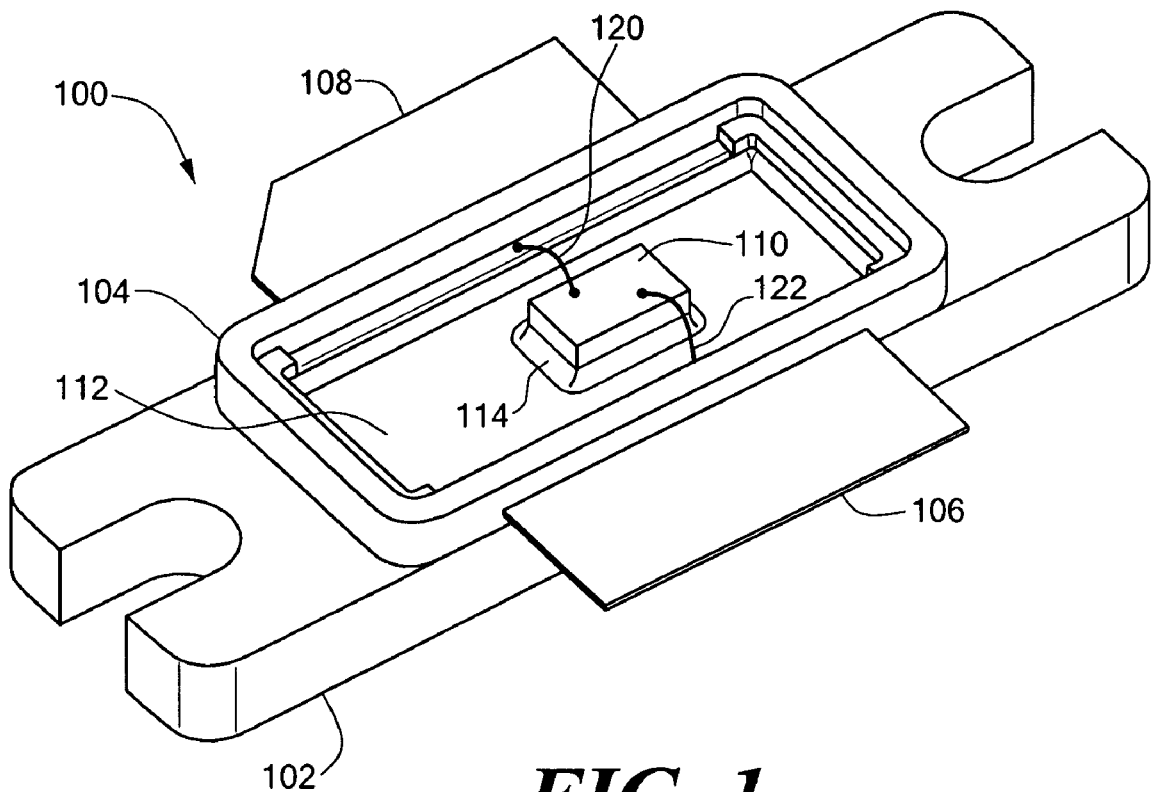
FIG. 1 is a perspective view of a circuit package, without a lid, according to one embodiment of the present invention.

One embodiment of a microcircuit package in accordance with the invention is shown in FIG. 1. The circuit package 100 includes a flange 102, a frame 104 and two leads 106 and 108 extending from respective sides of the package. The frame 104 electrically insulates the leads 106 and 108 from the flange 102 and from each other. A semiconductor die 110 is attached to a die attach area 112 within the area defined by the frame 104. The die 110 is attached to the die attach area 112 by a eutectic or other appropriate solder 114. In the illustrated embodiment only one die is shown, although two or more dies can typically be attached to the die attach area 112 in accordance with application and user requirements.

Figure 2:
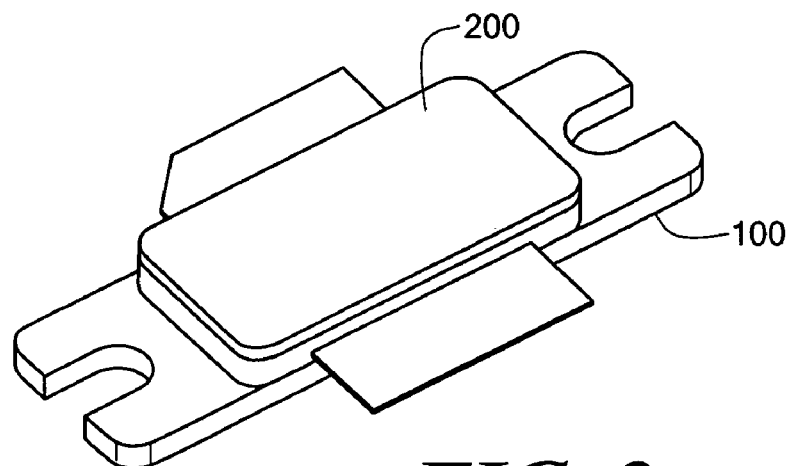
FIG. 2 is a perspective view of the circuit package of FIG. 1 with a lid attached thereto.

The eutectic solder 114 electrically bonds the die 110 to the confronting surface of the flange 102. The leads 106 and 108 are connected to contact areas of the die 110 by wire bonded leads 120 and 122. A lid 200 is attached to the confronting periphery of the frame 104 to enclose the die, as illustrated in FIG. 2.

The flange 102 forms a base to which other parts of the circuit package are attached, and also serves as a heat sink to conduct heat from the one or more semiconductor dies mounted in the package. The flange is preferably made of copper or a high copper alloy to provide high electrical and thermal conductivity. The frame 104 is made of an injection molded thermoplastic and is molded to the flange 102 and to the leads 106 and 108.

The frame material is preferably a liquid crystal polymer (LCP) that can withstand die attach temperatures which typically are 280-330° C. for AuSn soldering, or 390-420° C. for AuSi soldering. Preferable high temperature LCP frame materials are further described, for example, in Applicant's prior U.S. Pat. No. 7,053,299. The high temperature polymeric material can have a composition which includes one of the following chemical groups: hydroquinone (HQ), 4,4 bisphenol (BP), bis (4-hydroxylphenyl ether) (POP), terephthalic acid (TPA), 2,6 naphthalene dicarboxylic acid (NPA), 4,4 benzoic acid (BB), 4-hydroxybenzoic acid (HBA), 6-hydroxy-2-napthoic acid (HNA).

The leads 106 and 108 are preferably made of an alloy of copper which may be of many alternative compositions such as those described in the aforesaid U.S. Pat. No. 7,053,299. The copper alloys include those known under the UNS designations C19400, C15100, C19500, C19700, C50710, C19210, C19520, C18070, C19010, C70250, EFTEC-64T, KLF-25 and MF224.

Figure 3:
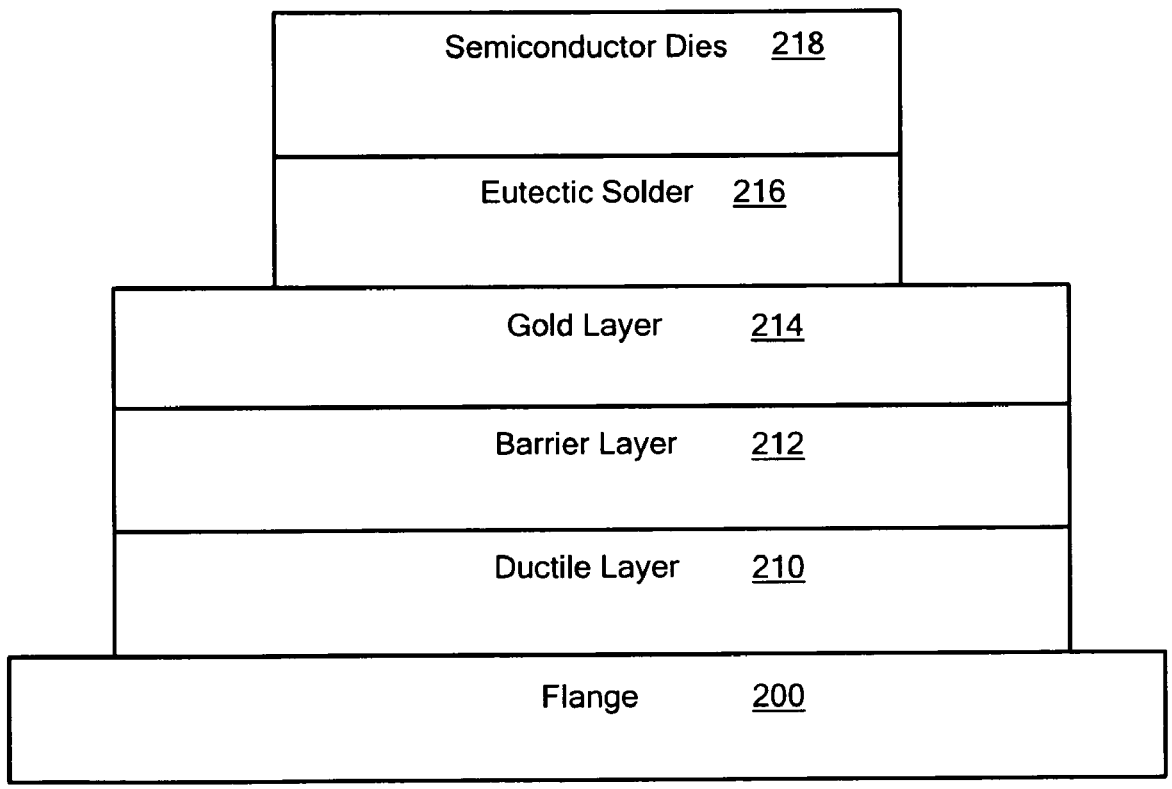
FIG. 3 is a diagrammatic elevation view of a circuit package in accordance with the invention illustrating the several layers.

In accordance with the present invention, a ductile layer is provided between the flange and the die attach. The multilayer structure of a preferred embodiment is illustrated in FIG. 3. Referring to FIG. 3, the microcircuit package comprises a flange or substrate 200 of copper or copper alloy, having a ductile layer 210, typically of copper or silver, applied on a surface of the flange. A barrier layer 212 of nickel or nickel cobalt is applied over the ductile layer, and a gold layer 214 is applied over the nickel layer. A eutectic solder 216, typically of gold-tin (AuSn), gold-silicon (AuSi), or gold-germanium (AuGe) is applied over the gold layer, and one or more semiconductor dies 218 are attached to the eutectic solder. The semiconductor dies can be fabricated from materials such as silicon, gallium arsenide, gallium nitride or any other suitable semiconductor material.

The flange 200 typically has a thickness in the range of about 0.040-0.060 inches. The ductile layer 210 has a thickness in the range of about 100-500 micro-inches. The barrier layer 212 has a thickness in the range of about 100-200 micro-inches. The semiconductor dies 218 typically have a thickness in the range of about 0.002-0.010 inches. The thickness of the gold layer 214 will depend upon the type of eutectic solder employed. For gold-tin (AuSn) solder, the gold layer on the flange has a thickness in the range of about 30-50 micro-inches.

In another embodiment, for a package having gold-tin solder, a gold layer of about 25 micro-inches is applied over a palladium layer of about 5 micro-inches.

When a eutectic solder of gold-silicon (Ausi) or gold germanium (AuGe) is used, the gold layer has a thickness in the range of about 100-200 micro-inches.

The eutectic solder can be a lead-free solder such as tin-silver-copper (SnAgCu), tin-silver (SnAg), antimony-tin (SbSn), tin-zinc (SnZn), bismuth (Bi) and tin-indium (SnIn). For use with these lead-free solders, a layer of nickel is applied at a thickness of about 150 micro-inches over the ductile layer. Optionally, a "flash" coating of about 5 micro-inches of gold can be applied over the nickel layer to prevent oxidation of the nickel.

The ductile layer 210 can be copper, silver, or an alloy of copper and silver, and the ductile layer can be provided in several different ways such as by plating, cladding, evaporation, and sputtering. The ductile layer has hardness less than about 80 Knoop and a thickness in the range of about 100 to 1000 micro-inches, and preferably in the range of about 100 to 500 micro-inches.

For efficient manufacturing, the flange 200 can be made of a harder form of copper or other suitable material, which is more resistant to damage during manufacturing such as scratches, nicks, and the like. A preferred hardness is greater than 80 Knoop and preferably in the range of about 85-100 Rockwell F.

In a preferred embodiment the flange 10 can be made of a copper zirconium alloy (CDA 151) which has hardness in the intended range of 85-100 Rockwell F.

As a comparison, the widely used oxygen-free copper (CDA101/102) is very soft and is prone to nicks, scratches and the like and has an annealing temperature of about 350° C. In contrast, CDA 151 copper has an annealing temperature greater than 500° C. and a significantly greater hardness. Thus, the harder flange material is more stable and suitable for efficient manufacturing processes.

The invention is not to be limited by what has been particularly shown and described but is to encompass the full spirit and scope of the claims.

What is claimed is:

1. A microcircuit package comprising:
   a substrate having a first surface, said substrate formed of copper, a copper alloy, silver or a silver alloy;
   a layer of ductile material having a first surface and a second surface, the first surface of the layer attached to the first surface of the substrate;
   a barrier layer having a first surface and a second surface, the first surface of the barrier layer attached to the second surface of the layer of ductile material;
   a gold layer having a first surface and a second surface, the first surface of the gold layer attached to the second surface of the barrier layer; and a eutectic layer having a first surface and a second surface, the first surface of the eutectic layer attached to the second surface of the gold layer, said eutectic layer formed of a gold-tin (AuSn) alloy, a gold-silicon (AuSi) alloy or a gold-germanium (AuGe) alloy, said first surface of said eutectic layer for mounting a semiconductor die thereon.

2. The microcircuit package of claim 1 wherein the layer of ductile material is silver, copper or an alloy of silver and copper.

3. The microcircuit package of claim 2 wherein the layer of ductile material is electroplated onto the first surface of the substrate.

4. The microcircuit package of claim 2 wherein the layer of ductile material is applied to the first surface of the substrate by plating, cladding, evaporation or sputtering.

5. The microcircuit package of claim 2 wherein the layer of ductile material has a hardness of less than about 80 Knoop and a thickness of about 100-1000 micro-inches.

6. The microcircuit package of claim 5 wherein the barrier layer is nickel or nickel cobalt.

7. The microcircuit package of claim 5 wherein the eutectic layer is a solder with a eutectic temperature of about 250° C. or higher.

8. The microcircuit package of claim 5 wherein the substrate is a copper zirconium alloy.

9. The microcircuit package of claim 5 wherein the substrate has a hardness of greater than about 80 Knoop.

10. The microcircuit package of claim 5 wherein the gold layer has a thickness of about 30-50 micro-inches.

11. The microcircuit package of claim 1 which also has a dielectric material attached which has a TOE in the range of 12-25 ppm/°C.

12. The microcircuit package of claim 11, where the dielectric material is a high temperature polymeric material that has a composition which includes a chemical group selected from the chemical groups consisting of: hydroquinone (HQ), 4,4 bisphenol (BP), bis (4-hydroxylphenyl ether) (POP), terephthalic acid (TPA), 2,6 naphthalene dicarboxylic acid (NPA), 4,4 benzoic acid (BB), 4-hydroxybenzoic acid (HBA), 6-hydroxy-2-napthoic acid (HNA).

13. The microcircuit package of claim 1, wherein the substrate is copper or a copper alloy.

14. The microcircuit package of claim 13, wherein the substrate has a thickness in the range of about 0.040-0.060 inches.

15. The microcircuit package of claim 1, wherein the substrate is copper or a copper alloy having a hardness greater than about 80 Knoop.

16. The microcircuit package of claim 15, wherein the substrate has a hardness in the range of about 85-100 Rockwell F.

17. The microcircuit package of claim 1 further including at least one semiconductor die attached to said second surface of said eutectic layer.

18. The microcircuit package of claim 5 wherein the layer of ductile material has a thickness of about 100-500 micro-inches.

19. The microcircuit package of claim 9 wherein the substrate has a hardness in the range of about 85-100 Rockwell F.

20. A microcircuit package comprising:
a substrate having a first surface, said substrate formed of copper, a copper alloy, silver or a silver alloy;
a layer of ductile material having a first surface and a second surface, the first surface of the layer attached to the first surface of the substrate;
a barrier layer having a first surface and a second surface, the first surface of the barrier layer attached to the second surface of the layer of ductile material;
a gold layer having a first surface and a second surface, the first surface of the gold layer attached to the second surface of the barrier layer; and
a eutectic layer having a first surface and a second surface, the first surface of the eutectic layer attached to the second surface of the gold layer, said eutectic layer formed of a lead free material selected from the group of a tin-silver-copper (SnAgCu) alloy, a tin-silver (SnAg) alloy, an antimony-tin (SbSn) alloy, a tin-zinc (SnZn) alloy, a tin-indium (SnIn) alloy and bismuth (Bi), said first surface of said eutectic layer for mounting a semiconductor die thereon.

21. The microcircuit package of claim 20 further including at least one semiconductor die attached to said second surface of said eutectic layer.

* * * * *

UNITED STATES PATENT AND TRADEMARK OFFICE
CERTIFICATE OF CORRECTION

PATENT NO. : 7,679,185 B2  Page 1 of 1
APPLICATION NO. : 11/983813
DATED : March 16, 2010
INVENTOR(S) : Michael A. Zimmerman et al.

It is certified that error appears in the above-identified patent and that said Letters Patent is hereby corrected as shown below:

Column 5, claim 11, line 32, "TOE" should read --CTE--.

Signed and Sealed this

Sixteenth Day of November, 2010

David J. Kappos
*Director of the United States Patent and Trademark Office*